(12) United States Patent
Chen et al.

(10) Patent No.: US 10,608,196 B2
(45) Date of Patent: Mar. 31, 2020

(54) QUANTUM-DOT DISPLAY SUBSTRATE, METHOD FOR PREPARING THE SAME, AND DISPLAY PANEL

(71) Applicant: BOE TECHNOLOGY GROUP CO., LTD., Beijing (CN)

(72) Inventors: Zhuo Chen, Beijing (CN); Yanzhao Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/053,419

(22) Filed: Aug. 2, 2018

(65) Prior Publication Data

US 2019/0207136 A1 Jul. 4, 2019

(30) Foreign Application Priority Data

Jan. 3, 2018 (CN) .......................... 2018 1 0003754

(51) Int. Cl.
*H01L 51/50* (2006.01)
*H01L 51/00* (2006.01)
*H01L 51/56* (2006.01)
*C09K 11/66* (2006.01)
*C09K 11/07* (2006.01)
(Continued)

(52) U.S. Cl.
CPC .......... *H01L 51/502* (2013.01); *C09K 11/02* (2013.01); *C09K 11/07* (2013.01); *C09K 11/565* (2013.01); *C09K 11/661* (2013.01); *C09K 11/663* (2013.01); *C09K 11/665* (2013.01); *C09K 11/70* (2013.01); *C09K 11/883* (2013.01); *H01L 51/009* (2013.01); *H01L 51/56* (2013.01); *H01L 27/3211* (2013.01)

(58) Field of Classification Search
None
See application file for complete search history.

(56) References Cited

U.S. PATENT DOCUMENTS 6,251,303 B1 * 6/2001 Bawendi ................ B82Y 15/00
  252/301.4 R
9,570,549 B2 * 2/2017 Jang ........................ B82Y 30/00
(Continued)

FOREIGN PATENT DOCUMENTS

| CN | 105449111 A | 3/2016 |
| CN | 105552241 A | 5/2016 |
| CN | 106356462 A | 1/2017 |

OTHER PUBLICATIONS

Tomczak, Nikodem, et al. "Polymer-Coated Quantum Dots." Nanoscale, vol. 5, No. 24, 2013, p. 12018., doi:10.1039/c3nr03949h. (Year: 2013).*

(Continued)

*Primary Examiner* — J. E. Schoenholtz
(74) *Attorney, Agent, or Firm* — Westman, Champlin & Koehler, P.A.

(57) ABSTRACT

The present disclosure discloses a quantum-dot display substrate, a method for preparing the same, and a display panel. The quantum-dot display substrate includes a substrate and a plurality of light emitting sub-pixels disposed on the substrate, in which each of the light emitting sub-pixels includes a quantum-dot light emitting layer, and the quantum-dot light emitting layer includes a crosslinked network formed by crosslinking quantum dots having a crosslinkable ligand with a crosslinking agent.

15 Claims, 3 Drawing Sheets

Formula 1    Formula 2    Formula 3

(51) Int. Cl.
*C09K 11/56* (2006.01)
*C09K 11/02* (2006.01)
*C09K 11/88* (2006.01)
*C09K 11/70* (2006.01)
*H01L 27/32* (2006.01)

(56) References Cited

U.S. PATENT DOCUMENTS

| | | | | |
|---|---|---|---|---|
| 10,224,483 B2* | 3/2019 | Li | ............... | G03F 7/0007 |
| 2008/0238299 A1* | 10/2008 | Cho | ............... | B82Y 20/00 |
| | | | | 313/503 |
| 2008/0272347 A1* | 11/2008 | Fukuda | ............... | C07F 9/5304 |
| | | | | 252/586 |
| 2009/0152664 A1* | 6/2009 | Klem | ............... | H01L 27/14603 |
| | | | | 257/440 |
| 2012/0001217 A1* | 1/2012 | Kang | ............... | C08G 75/045 |
| | | | | 257/98 |
| 2012/0195340 A1* | 8/2012 | Cheon | ............... | H01L 33/501 |
| | | | | 372/50.1 |
| 2015/0115217 A1* | 4/2015 | Cho | ............... | H01L 51/502 |
| | | | | 257/13 |
| 2015/0218444 A1* | 8/2015 | Kang | ............... | C09K 11/703 |
| | | | | 252/519.34 |
| 2017/0158954 A1* | 6/2017 | Yang | ............... | C09K 11/025 |
| 2017/0162756 A1* | 6/2017 | Hartlove | ............... | B01J 13/08 |
| 2018/0062101 A1 | 3/2018 | Li et al. | | |
| 2018/0108842 A1 | 4/2018 | Li et al. | | |
| 2020/0028106 A1 | 1/2020 | Li et al. | | |

OTHER PUBLICATIONS

First Office Action, including Search Report, for Chinese Patent Application No. 201810003754.0, dated Dec. 17, 2019, 14 pages.

* cited by examiner

QUANTUM-DOT DISPLAY SUBSTRATE, METHOD FOR PREPARING THE SAME, AND DISPLAY PANEL

CROSS-REFERENCE TO RELATED APPLICATION

The present disclosure claims a priority to Chinese Patent Application No. 201810003754.0 filed on Jan. 3, 2018, the disclosures of which are incorporated in their entirety by reference herein.

TECHNICAL FIELD

The present disclosure relates to the field of display technology, and in particular, to a quantum-dot display substrate, a method for preparing the same, and a display panel.

BACKGROUND

Active-matrix organic light emitting diodes (AMOLEDs) have been recognized as promising next-generation displays for replacing liquid crystal displays (LCDs). However, as consumers' consumption levels increase, high-resolution products become a key development direction of display products. Unfortunately, high-resolution AMOLED products can hardly compete with LCDs, because the organic layer structures of organic light emitting displays are usually prepared by mask evaporation method, and the mask evaporation method has several drawbacks, such as difficulty in alignment, low yield, inability to realize light emitting in smaller pixel areas, inability to accurately control evaporation areas, and thus such AMOLED products cannot meet the rapidly growing need for high-resolution displays. On the other hand, an organic light emitting layer prepared by printing method instead of mask evaporation method has extremely limited resolution. Therefore, high-resolution AMOLED products encounter several problems, like high technical difficulty, low product yield, and high commodity price.

Quantum dots (QDs), also known as nanocrystals, are nanoparticles composed of Groups II-VI or III-V elements. Since electrons and holes are confined by quantum, a continuous band structure will become a discrete energy level structure with molecular properties. After being excited, QDs may emit fluorescence. The luminescence spectrum thereof may be controlled by changing the size of QDs, and the fluorescence intensity and stability are both good. Thus, QDs is a very good electroluminescent material.

With the further development of quantum-dot technology, the researches on electroluminescent quantum-dot light emitting diodes have been becoming further, and quantum efficiency has been continuously improved and basically reached the industrialization level. It has become trends and the future to employ new processes and technologies so as to achieve industrialization of the electroluminescent quantum-dot light emitting diodes. In order to improve the resolution of organic light emitting diodes (OLEDs), there are needs to modify the OLED evaporation mask plate to further reduce the line width in the mask process, to use a higher-precision print head, etc. These needs are often difficult to be satisfied in large-scale production process.

SUMMARY

One embodiment of the present disclosure provides a quantum-dot display substrate, which includes a substrate and a plurality of light emitting sub-pixels disposed on the substrate, wherein each of the light emitting sub-pixels includes a quantum-dot light emitting layer, and the quantum-dot light emitting layer includes a crosslinked network formed by crosslinking QDs having a crosslinkable ligand with a crosslinking agent.

In one example, the crosslinkable ligand of the QDs includes a group R1, the crosslinking agent includes a group R2, and the group R1 and the group R2 are capable of crosslinking with each other.

In one example, a combination of the group R1 and the group R2 is at least one selected from a group consisting of mercapto/alkenyl, mercapto/alkynyl, and alkynyl/azido.

In one example, the crosslinkable ligand of the QDs is 1-mercapto-8-nonyne or 1-mercapto-9-trimethylsilyl-8-nonyne.

In one example, the crosslinking agent is 1,4-bis(3-azidopropyl)benzene.

In one example, a quantum-dot material of the QDs is at least one selected from the group consisting of CdS, CdSe, CdTe, ZnSe, InP, PbS, $CsPbCl_3$, $CsPbBr_3$, $CsPhI_3$, CdS/ZnS, CdSe/ZnS, ZnSe, InP/ZnS, PbS/ZnS, $CsPbCl_3$/ZnS, $CsPbBr_3$/ZnS, and $CsPhI_3$/ZnS.

Another embodiment of the present disclosure provides a display panel which includes the above quantum-dot display substrate.

One further embodiment of the present disclosure provides a method for preparing a quantum-dot display substrate, which includes:

step 1, coating QDs having a crosslinkable ligand on a substrate to form a quantum-dot film;

step 2, coating a photoresist on the quantum-dot film and patterning the photoresist;

step 3, applying a crosslinking agent capable of crosslinking with the QDs on the substrate including the quantum-dot film and the patterned photoresist, and crosslinking the QDs being not covered by the photoresist with the crosslinking agent to form a crosslinked network; and step 4, successively removing the crosslinking agent, the photoresist, and the QDs which are not formed as the crosslinked network, and reserving the QDs which are formed as the crosslinked network, to obtain a quantum-dot light emitting layer corresponding to patterns of a plurality of light emitting sub-pixels.

In one example, coating the QDs having the crosslinkable ligand on the substrate includes:

coating the QDs having the crosslinkable ligand on the substrate by employing at least one method selected from spin coating, slot coating, and blade coating.

In one example, coating the QDs having the crosslinkable ligand on the substrate includes:

coating the QDs having the crosslinkable ligand on the substrate by employing a dispenser of a lithography equipment.

In one example, steps 1 to 4 are repeated at least twice to obtain the quantum-dot light emitting layer having at least two colors and corresponding to the patterns of the plurality of light emitting sub-pixels.

In one example, the crosslinkable ligand of the QDs includes a group R1, the crosslinking agent includes a group R2, the group R1 and the group R2 are capable of crosslinking with each other, and a combination of the group R1 and the group R2 is at least one selected from a group consisting of mercapto/alkenyl, mercapto/alkynyl, and alkynyl/azido.

In one example, the crosslinkable ligand of the QDs is 1-mercapto-8-nonyne or 1-mercapto-9-trimethylsilyl-8-nonyne.

In one example, the crosslinking agent is 1,4-bis(3-azidopropyl)benzene.

In one example, a quantum-dot material of the QDs is at least one selected from the group consisting of CdS, CdSe, CdTe, ZnSe, InP, PbS, $CsPbCl_3$, $CsPbBr_3$, $CsPhI_3$, CdS/ZnS, CdSe/ZnS, ZnSe, InP/ZnS, PbS/ZnS, $CsPbCl_3$/ZnS, $CsPbBr_3$/ZnS, and $CsPhI_3$/ZnS.

BRIEF DESCRIPTION OF THE DRAWINGS

Other features, objects, and advantages of the present disclosure will become more apparent by reading the following detailed description of non-limiting embodiments with reference to the following drawings:

FIGS. 5-1 to 5-6 are process views of preparing a quantum-dot display substrate in accordance with one embodiment of the present disclosure.

DETAILED DESCRIPTION

Figure 1:
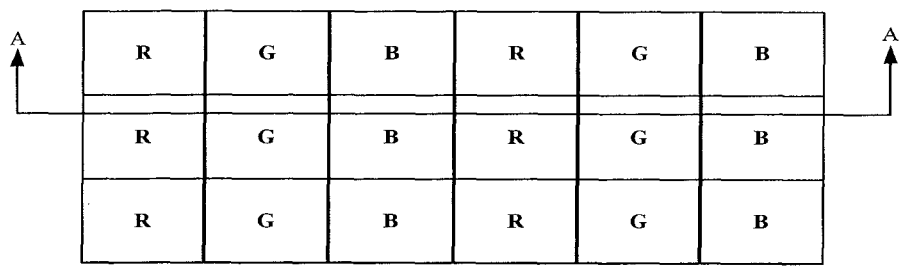
FIG. 1 is a schematic plan view of a quantum-dot display substrate in accordance with one embodiment of the present disclosure.

The present disclosure will be further described hereinafter in detail with reference to the drawings and embodiments. It will be understood that the specific embodiments herein are only used to illustrate the technical solutions and not to limit the present disclosure. Moreover, it should also be noted that, for ease of description, only the parts related to the present disclosure are shown in the drawings.

It should be noted that the embodiments in the present disclosure and the features in the embodiments may be combined with each other, as long as they do not contradict each other.

The present disclosure will be described hereinafter in detail with reference to the drawings in combination with the embodiments.

Thickness, area size and shape of each component in the drawings do not reflect the true proportions of the components, and are only intended to schematically illustrate the present disclosure.

One embodiment of the present disclosure provides a preparation scheme for a quantum-dot display substrate capable of achieving high resolution, increasing process yield, and improving utilization of QDs.

Figure 2:
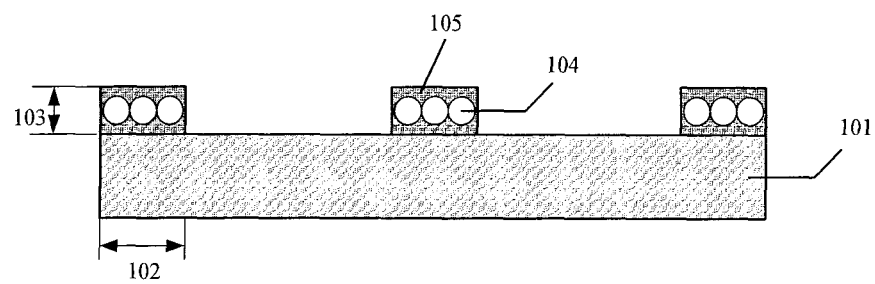
FIG. 2 is a schematic sectional view of a quantum-dot display substrate along line A-A in accordance with one embodiment of the present disclosure.

One embodiment of the present disclosure provides a quantum-dot display substrate, as shown in FIGS. 1 and 2, which is a quantum-dot light emitting diode substrate and includes a substrate 101 and a plurality of light emitting sub-pixels 102 (e.g., Red, Green and Blue (RGB) sub-pixels arranged in an array) disposed on the substrate 101, each of the light emitting sub-pixels 102 includes a quantum-dot light emitting layer 103, and the quantum-dot light emitting layer 103 includes a crosslinked network formed by crosslinking QDs 104 having a crosslinkable ligand with a crosslinking agent 105.

Herein, in accordance with the color of the light to be emitted by each of the light emitting sub-pixels 102, the QDs 104 may include QDs of various colors, such as green light emitting QDs, blue light emitting QDs, red light emitting QDs.

The quantum-dot light emitting diode substrate may be prepared with a higher resolution through a convenient process, and thus is suitable for large-scale production. The preparation method has an improved process yield and is suitable for large-scale production. It should be understood that the term "quantum-dot light emitting diode substrate" in the present disclosure refers to a substrate containing a light emitting diode, where the light emitting diode includes QDs configured to be capable of emitting light. Therefore, the light emitting diode substrate in the present disclosure may be an array substrate or a display substrate.

In one example, the crosslinkable ligand of the QDs 104 includes a group R1, the crosslinking agent 105 includes a group R2, and the group R1 and the group R2 are capable of crosslinking with each other.

When a crosslinked network is formed by crosslinking the QDs 104 with the crosslinking agent 105, the quantum-dot film composed of the QDs 104 will be fixed, unable to be cleaned off by a solvent, and will not be affected by a solvent for the next layer. Here, a solvent for the next layer means a solvent used for preparing the next layer. On the other hand, the quantum-dot film which is not formed as the crosslinked network may be cleaned off by a solvent. By utilizing this property, the quantum-dot film may be patterned.

In addition, the quantum-dot film which is not formed as a crosslinked network may also be recycled and reused, thereby maximize the utilization of the QDs.

Figure 3:
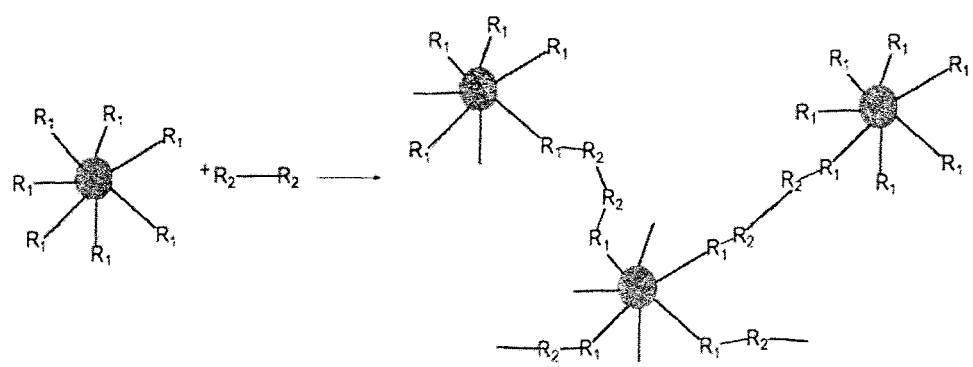
FIG. 3 is a schematic principle diagram of QDs crosslinking with a crosslinking agent to form a crosslinked network in accordance with one embodiment of the present disclosure.

FIG. 3 is a schematic principle diagram of the QDs 104 corsslinking with the crosslinking agent 105 to form a crosslinked network. In FIG. 3, Formula 1 represents the QDs 104 having a group R1, Formula 2 represents the crosslinking agent 105 having a group R2, and the group R1 and the group R2 are capable of crosslinking with each other, to form a crosslinked network of Formula 3 for example.

In one example, a combination of the group R1 and the group R2 may be at least one selected from a group consisting of mercapto/alkenyl, mercapto/alkynyl, and alkynyl/azido.

In one example, the crosslinkable ligand of the QDs is 1-mercapto-8-nonyne or 1-mercapto-9-trimethylsilyl-8-nonyne.

In one example, the crosslinking agent is 1,4-bis(3-azidopropyl)benzene.

In one example, the quantum-dot material of the QDs 104 may be at least one selected from the group consisting of CdS, CdSe, CdTe, ZnSe, InP, PbS, $CsPbCl_3$, $CsPbBr_3$, $CsPhI_3$, CdS/ZnS, CdSe/ZnS, ZnSe, InP/ZnS, PbS/ZnS, $CsPbCl_3$/ZnS, $CsPbBr_3$/ZnS, and $CsPhI_3$/ZnS.

Moreover, it should also be noted that the quantum-dot light emitting diode substrate in the embodiment of the present disclosure is not limited to the traditional RGB pixel layout, but may also be an RGBW (red, green, blue and white) pixel layout, or a pixel layout where the sub-pixel areas of RGB or RGBW are different. This will not be limited in this embodiment of the present disclosure.

The quantum-dot display substrate in accordance with the embodiment of the present disclosure modifies the quantum-dot ligand to be a crosslinkable ligand, so that the QDs are capable of crosslinking with a crosslinking agent to form a crosslinked network, thereby forming a quantum-dot light emitting layer corresponding to the patterns of the plurality of light emitting sub-pixels. As compared with the related art, the method in accordance with the embodiment of the present disclosure can prepare a quantum-dot display substrate with a high resolution through a convenient process, and thus is suitable for large-scale production.

The present disclosure will be further described hereinafter in conjunction with specific embodiments, but the present disclosure is not limited to the following embodiments.

Figure 4:
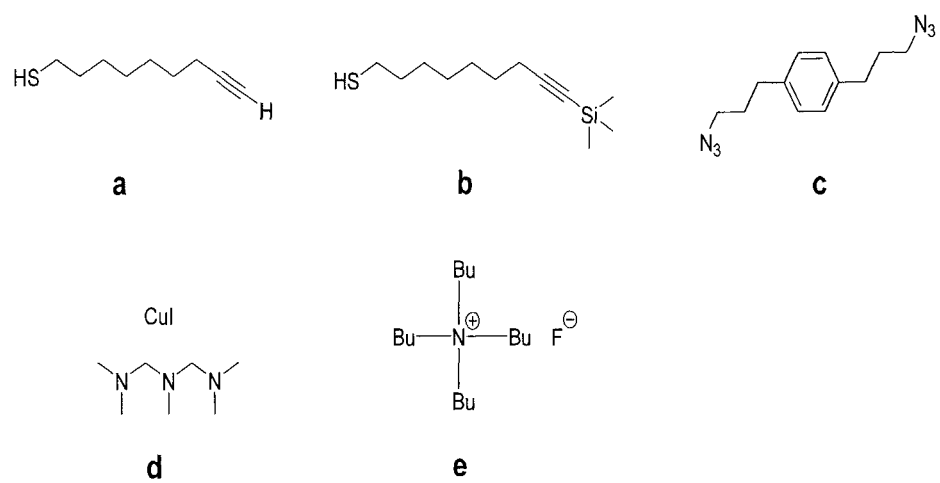
FIG. 4 is a schematic diagram of a system containing a quantum-dot ligand and a crosslinking agent in accordance with one embodiment of the present disclosure.

For example, in one embodiment of the present disclosure, the QDs 104 may be QDs of CdSe-type or CdSe/ZnS-type, and the structure of the ligand containing a group R1 may be a and b as shown in FIG. 4. In FIG. 4, the structure of the ligand shown in a is $SH(CH_2)_7C\equiv CH$ (i.e. 1-mercapto-8-nonyne), and the structure of the ligand shown in b is $SH(CH_2)_7C\equiv CSi(CH_3)_3$ (i.e. 1-mercapto-9-trimethylsilyl-8-nonyne). The ligands of these two structures may act as the ligands in the reaction for preparing QDs, and they may be either directly connected to the QDs, or attached to the QDs through ligand substitution reaction after the QDs are prepared.

The structure of the crosslinking agent 105 may be c (i.e. 1,4-bis(3-azidopropyl)benzene) as shown in FIG. 4, and the catalyst may be d (i.e. copper iodide (CuI) and N,N,N',N",N"-pentamethyldimethylenetriamine) as shown in FIG. 4. When the ligand structure of b as shown in FIG. 4 is used, an in situ deprotected reagent as shown in e (i.e. tetrabutylammonium fluoride) of FIG. 4 needs to be added to the crosslinking solution 105.

The quantum-dot display substrate in accordance with the embodiment of the present disclosure may be prepared with a higher resolution through a convenient process, and thus is suitable for large-scale production.

Based on the same inventive concept, one embodiment of the present disclosure further provides a display panel which includes the above quantum-dot display substrate. Other essential components of the display panel should be understood by a person skilled in the art, and thus will not be reiterated herein.

Figures 1, 5:
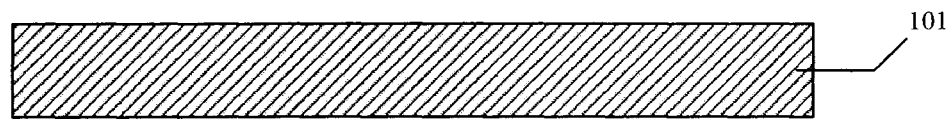
Figures 2, 5:
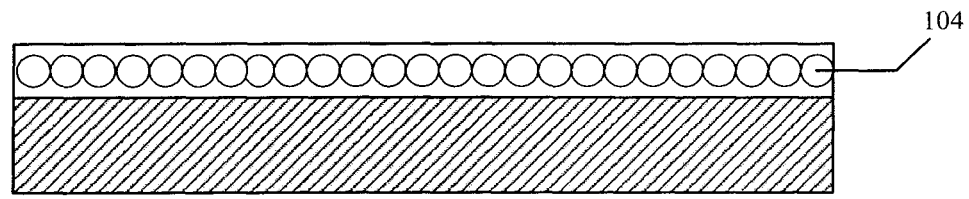
Figures 3, 5:
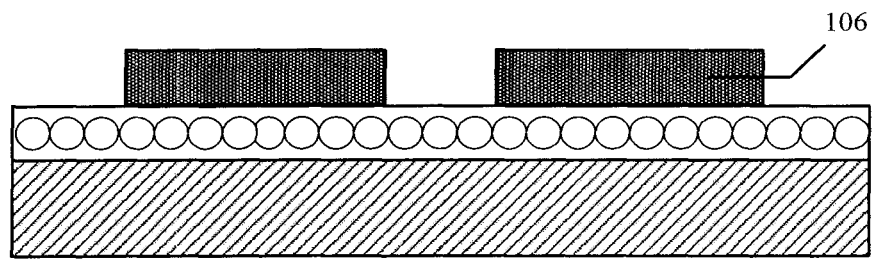
Figures 4, 5:
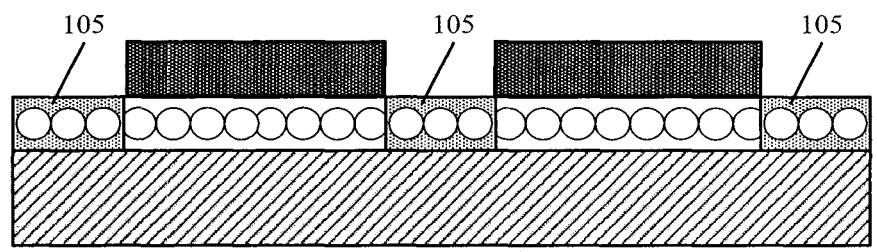
Figure 5:
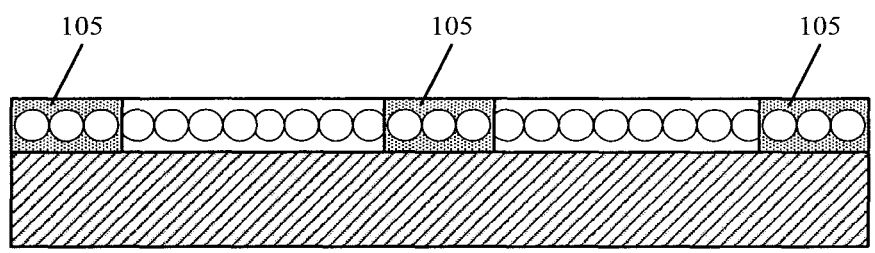
Figures 5, 6:
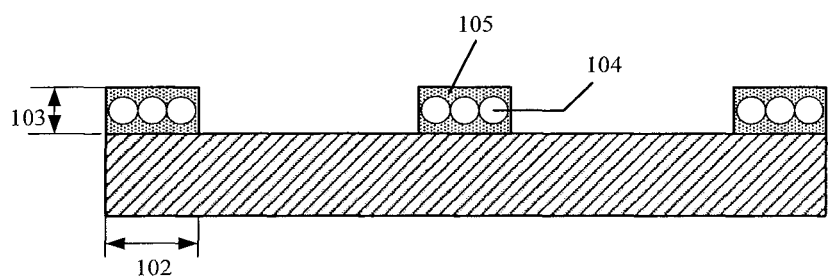

Based on the same inventive concept, the embodiment of the present disclosure also provides a method for preparing the above quantum-dot display substrate, as shown in FIGS. 5-1 to 5-6, in which the quantum-dot display substrate is a quantum-dot light emitting diode substrate. This exemplary process will be described hereafter with reference to the drawings.

As shown in FIG. 5-1, a substrate 101 is provided, where the substrate is a base substrate. The base substrate is, for example, a glass substrate, a plastic substrate, or the like.

As shown in FIG. 5-2, QDs 104 having a crosslinkable ligand are coated on the substrate 101 to form a quantum-dot film.

In one example, the QDs 104 having the crosslinkable ligand may be coated on the substrate 101 by employing at least one method selected from spin coating, slot coating, blade coating, etc. in this step.

In one example, the QDs 104 having the crosslinkable ligand may be coated on the substrate 101 by employing a dispenser of a lithography equipment.

As shown in FIG. 5-3, a photoresist 106 is coated on the quantum-dot film, and the photoresist 106 is patterned.

For example, the photoresist 106 may be exposed by using a mask, followed by a development, to reveal the areas where the QDs need to be reserved.

As shown in FIG. 5-4, a crosslinking agent 105 capable of crosslinking with the QDs 104 is applied to the substrate 101 including the quantum-dot film and the patterned photoresist 106, and after a preset period of time the excess crosslinking agent 105 is removed.

For example, the substrate 101 including the quantum-dot film and the patterned photoresist 106 may be dipped in a solution (i.e. a crosslinking liquid) containing a group R2 and a corresponding catalyst; or the substrate 101 may be rinsed using the crosslinking liquid 105.

At this time, the portion of the quantum-dot film not protected by the photoresist 106 is crosslinked, and the portion of the quantum-dot film protected by the photoresist 106 remains in the original state and is not crosslinked.

As shown in FIG. 5-5, the photoresist 106 is removed.

As shown in FIG. 5-6, the QDs 104 which are not formed as the crosslinked network are removed, and the QDs 104 which are formed as the crosslinked network are reserved, such that a quantum-dot light emitting layer 103 corresponding to the patterns of the plurality of light emitting sub-pixels 102 is obtained.

In one example, the process may be repeated, for example, the above process from FIG. 5-1 to FIG. 5-6 may be repeated at least twice, so as to obtain a quantum-dot light emitting layer 103 having at least two colors and corresponding to the patterns of the plurality of light emitting sub-pixels 102.

The quantum-dot display substrate in accordance with the embodiment of the present disclosure may be prepared with a higher resolution through a convenient process, and thus is suitable for large-scale production. The method for preparing the above quantum-dot display substrate has an improved process yield and is suitable for large-scale production.

The present disclosure will be further described hereinafter in conjunction with specific embodiments, but the present disclosure is not limited to the following embodiments.

One embodiment of the present disclosure provides a method for preparing an R/G/B tricolor AMQLED, which for example includes the following steps:

In step 1, a TFT (thin film transistor) back plate is prepared.

For example, a transparent substrate is cleaned by a standard method, and then the following steps are performed in sequence: 200 nm thick of gate metal Mo is deposited and patterned; 150 nm thick of gate dielectric $SiO_2$ is deposited; 40 nm thick of active layer IGZO is deposited and patterned; 200 nm thick of source and drain metal Mo is deposited and patterned; 300 nm thick of passivation layer $SiO_2$ is deposited and patterned; 40 nm thick of pixel electrode ITO is deposited and patterned; finally, acrylic material is spin-coated, photoetched and cured to form an around 1.5 microns thick of pixel defining layer, thereby forming a TFT back plate portion.

In step 2, a hole injection layer and a hole transport layer are prepared on the TFT back plate by using a spin coating process. For example, the hole injection layer may be formed by spin-coating with PEDOT (i.e. poly(3,4-ethylenedioxythiophene)): PSS (i.e. polystyrene sulfate) in a thickness of around 30 nm, and the hole transport layer may be formed by spin-coating with PVK (i.e. polyvinylcarbazole) or TFB ((9,9-dioctylfluorenyl-2,7-diyl)-co(4,4'-(N-(4-sec-butylphenyl)diphenylamine)) in a thickness of around 40 nm.

In step 3, red QDs with a crosslinkable ligand having the structure as shown in b of FIG. 4 is spin-coated on the hole-transport layer, in a thickness of around 10 nm, to form a single-layer quantum-dot film.

In step 4, a photoresist is coated on the quantum-dot film, followed by a precise alignment with a mask, exposure, and development, to reveal the areas where the quantum-dots need to be crosslinked.

In step 5, the back plate is rinsed with the crosslinking liquid containing the structures as shown in c, d and e of FIG. 4, to crosslinking the QDs in the areas which are not protected by the photoresist.

In step 6, the substrate is flushed with tetrahydrofuran solvent, to remove the excess crosslinking liquid.

In step 7, the photoresist is removed.

In step 8, the uncrosslinked red QDs (which may be recycled and reused) are washed off with a solvent such as toluene and hexane, thereby forming a red quantum-dot light emitting layer corresponding to the patterns of the red light emitting sub-pixels.

In step 9, steps 3 to 8 are repeated, to form a green quantum-dot light emitting layer and a blue quantum-dot light emitting layer, respectively.

In step 10, common ZnO nanoparticles are spin-coated on the quantum-dot pixels to form a common electron transport layer.

In step 11, an aluminum electrode (of a bottom emission structure) or a magnesium/silver alloy electrode (of a top emission structure) is vapor deposited to form a cathode.

In step 12, the obtained components are packaged.

In one embodiment of the present disclosure, the red quantum-dot light emitting layer, green quantum-dot light emitting layer, and blue quantum-dot light emitting layer are formed by crosslinking the QDs having a crosslinkable ligand with a crosslinking agent, therefore it is possible to avoid the technical difficulty of increasing the resolution encountered in the OLED display (e.g., needs to modify the the OLED evaporation mask plate to further reduce the line width in the mask process and to use a higher-precision print head, etc.), and effectively realize production of high-resolution AMQLED products, facilitate the preparation process, improve the process yield, and significantly increase the utilization of quantum-dot materials.

Moreover, in one embodiment of the present disclosure, there is no limitation to the order of the formation of the red quantum-dot light emitting layer, the green quantum-dot light emitting layer and the blue quantum-dot light emitting layer, and it is not limited to form red, green and blue quantum-dot light emitting layers, either. In the actual preparation, for example, it is feasible to form only one or two selected from the green quantum-dot light emitting layer, the blue quantum-dot light emitting layer and the red quantum-dot light emitting layer from the QDs, and for other colors, organic electroluminescence material may be employed.

In summary, the embodiments of the present disclosure provide a quantum-dot display substrate, a method for preparing the same, and a display panel. In the technical solution, it is possible to avoid the technical difficulty of increasing the resolution encountered in the OLED display (e.g., needs to modify the the OLED evaporation mask plate to further reduce the line width in the mask process and to use a higher-precision print head, etc.), and effectively realize production of high-resolution AMQLED products, facilitate the preparation process, improve the process yield, and significantly increase the utilization of quantum-dot materials.

The above descriptions are only alternative embodiments of the present disclosure and illustrations of the applied technical principles. A person skilled in the art should understand that the scope of the invention referred to in the present disclosure is not limited to the technical solutions specifically combined by the above technical features, but also covers other technical solutions formed by any combination of the above technical features or the equivalent features thereof without departing from the inventive concept, e.g., technical solutions formed by the interchange of the above features and the technical features having similar functions disclosed in (but not limited to) the present disclosure.

What is claimed is:

1. A quantum-dot display substrate, comprising:
    a substrate and a plurality of light emitting sub-pixels disposed on the substrate, wherein each of the light emitting sub-pixels comprises a quantum-dot light emitting layer, and the quantum-dot light emitting layer comprises a crosslinked network formed by crosslinking quantum dots having a crosslinkable ligand and a crosslinking agent,
    wherein the crosslinkable ligand of the quantum dots comprises a group R1, the crosslinking agent comprises a group R2, and the group R1 and the group R2 are capable of crosslinking with each other; and
    wherein a combination of the group R1 and the group R2 is at least one selected from a group consisting of mercapto/alkenyl, mercapto/alkynyl, and alkynyl/azido; and
    wherein the crosslinkable ligand of the quantum dots is 1-mercapto-8-nonyne or 1-mercapto-9-trimethylsilyl-8-nonyne.

2. A quantum-dot display substrate, comprising:
    a substrate and a plurality of light emitting sub-pixels disposed on the substrate, wherein each of the light emitting sub-pixels comprises a quantum-dot emitting layer, and the quantum-dot light emitting layer comprises a crosslinked network formed by crosslinking quantum dots having a crosslinkable ligand and a crosslinking agent,
    wherein the crosslinkable ligand of the quantum dots comprises a group R1, the crosslinking agent comprises a group R2, and the group R1 and the group R2 are capable of crosslinking with each other;
    wherein a combination of the group R1 and the group R2 is at least one selected from a group consisting of mercapto/alkenyl, mercapto/alkynyl, and alkynyl/azido; and
    wherein the crosslinking agent is 1,4-bis(3-azidopropyl)benzene.

3. The quantum-dot display substrate of claim 1, wherein a quantum-dot material of the quantum dots is at least one selected from a group consisting of CdS, CdSe, CdTe, ZnSe, InP, PbS, $CsPbCl_3$, $CsPbBr_3$, $CsPhI_3$, CdS/ZnS, CdSe/ZnS, ZnSe/ZnS, InP/ZnS, PbS/ZnS, $CsPbCl_3$/ZnS, $CsPbBr_3$/ZnS, and $CsPhI_3$/ZnS.

4. A display panel, comprising the quantum-dot display substrate of claim 1.

5. The display panel of claim 4, wherein the crosslinkable ligand of the quantum dots is 1-mercapto-8-nonyne or 1-mercapto-9-trimethylsilyl-8-nonyne.

6. The display panel of claim 4, wherein a quantum-dot material of the quantum dots is at least one selected from a group consisting of CdS, CdSe, CdTe, ZnSe, InP, PbS, $CsPbCl_3$, $CsPbBr_3$, $CsPhI_3$, CdS/ZnS, CdSe/ZnS, ZnSe/ZnS, InP/ZnS, PbS/ZnS, $CsPbCl_3$/ZnS, $CsPbBr_3$/ZnS, and $CsPhI_3$/ZnS.

7. A method for preparing a quantum-dot display substrate, comprising:
step 1, coating quantum dots having a crosslinkable ligand on a substrate to form a quantum-dot film;
step 2, coating a photoresist on the quantum-dot film and patterning the photoresist;
step 3, applying a crosslinking agent capable of crosslinking with the quantum dots on the substrate comprising the quantum-dot film and a patterned photoresist, and crosslinking the quantum dots being not covered by the photoresist with the crosslinking agent to form a crosslinked network; and
step 4, successively removing the crosslinking agent, the photoresist, and the quantum dots which are not formed as the crosslinked network, and reserving the quantum dots which are formed as the crosslinked network, to obtain a quantum-dot light emitting layer corresponding to patterns of a plurality of light emitting sub-pixels.

8. The method of claim 7, wherein the coating the quantum dots having the crosslinkable ligand on the substrate comprises:
coating the quantum dots having the crosslinkable ligand on the substrate by employing at least one method selected from spin coating, slot coating, and blade coating.

9. The method of claim 7, wherein the coating the quantum dots having the crosslinkable ligand on the substrate comprises:
coating the quantum dots having the crosslinkable ligand on the substrate by employing a dispenser of a lithography equipment.

10. The method of claim 7, wherein steps 1 to 4 are repeated at least twice to obtain the quantum-dot light emitting layer having at least two colors and corresponding to the patterns of the plurality of light emitting sub-pixels.

11. The method of claim 7, wherein the crosslinkable ligand of the quantum dots comprises a group R1, the crosslinking agent comprises a group R2, the group R1 and the group R2 are capable of crosslinking with each other, and a combination of the group R1 and the group R2 is at least one selected from a group consisting of mercapto/alkenyl, mercapto/alkynyl, and alkynyl/azido.

12. The method of claim 7, wherein the crosslinkable ligand of the quantum dots is 1-mercapto-8-nonyne or 1-mercapto-9-trimethylsilyl-8-nonyne.

13. The method of claim 7, wherein the crosslinking agent is 1,4-bis(3-azidopropyl)benzene.

14. The method of claim 7, wherein a quantum-dot material of the quantum dots in step 1 is at least one selected from a group consisting of CdS, CdSe, CdTe, ZnSe, InP, PbS, $CsPbCl_3$, $CsPbBr_3$, $CsPhI_3$, CdS/ZnS, CdSe/ZnS, ZnSe/ZnS, InP/ZnS, PbS/ZnS, $CsPbCl_3$/ZnS, $CsPbBr_3$/ZnS, and $CsPhI_3$/ZnS.

15. A display panel, comprising the quantum-dot display substrate of claim 2.

* * * * *